(12) United States Patent
Morita et al.

(10) Patent No.: US 6,750,087 B2
(45) Date of Patent: Jun. 15, 2004

(54) THIN FILM TRANSISTOR ARRAY, FABRICATION METHOD THEREOF, AND LIQUID CRYSTAL DISPLAY DEVICE EMPLOYING THE SAME

(75) Inventors: Hiromasa Morita, Kikuchi-gun (JP); Ken Nakashima, Kikuchi-gun (JP)

(73) Assignee: Advanced Display Inc., Kikuchi-gun (JP)

( * ) Notice: Subject to any disclaimer, the term of this patent is extended or adjusted under 35 U.S.C. 154(b) by 0 days.

(21) Appl. No.: 10/403,121

(22) Filed: Apr. 1, 2003

(65) Prior Publication Data

US 2003/0186478 A1 Oct. 2, 2003

(30) Foreign Application Priority Data

Apr. 2, 2002 (JP) .......................................... 2002-099990

(51) Int. Cl.[7] .............................................. H01L 21/84
(52) U.S. Cl. .................... 438/151; 438/586; 438/945
(58) Field of Search ......................... 438/30, 151, 157, 438/158, 586, 587, 597, 652, 945

(56) References Cited

U.S. PATENT DOCUMENTS 5,926,702 A * 7/1999 Kwon et al. ................ 438/151
6,025,216 A * 2/2000 Ha ............................. 438/151
6,317,174 B1 * 11/2001 Noumi et al. ................ 438/30
6,452,210 B2 * 9/2002 Lee ............................. 257/59

FOREIGN PATENT DOCUMENTS

| JP | 2000-11958 | 4/2000 |
|---|---|---|
| JP | 2001-339072 | 7/2001 |

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A fabrication method of a thin film transistor array substrate includes a step of forming a gate insulation film, a semiconductor layer, an ohmic layer, and a metal film on the insulating substrate on which the gate line is formed, a step of forming a resist pattern on the metal film by a photolithography process so that its thickness is thinner on the corresponding section to the semiconductor active layer than on the other sections, a step of etching the metal film to form the source line, the source electrode, and the drain electrode, a step of removing the ohmic layer and the semiconductor layer after removing the resist on the corresponding section to the semiconductor active layer, a step of removing the metal film, and a step of removing the ohmic layer.

11 Claims, 12 Drawing Sheets

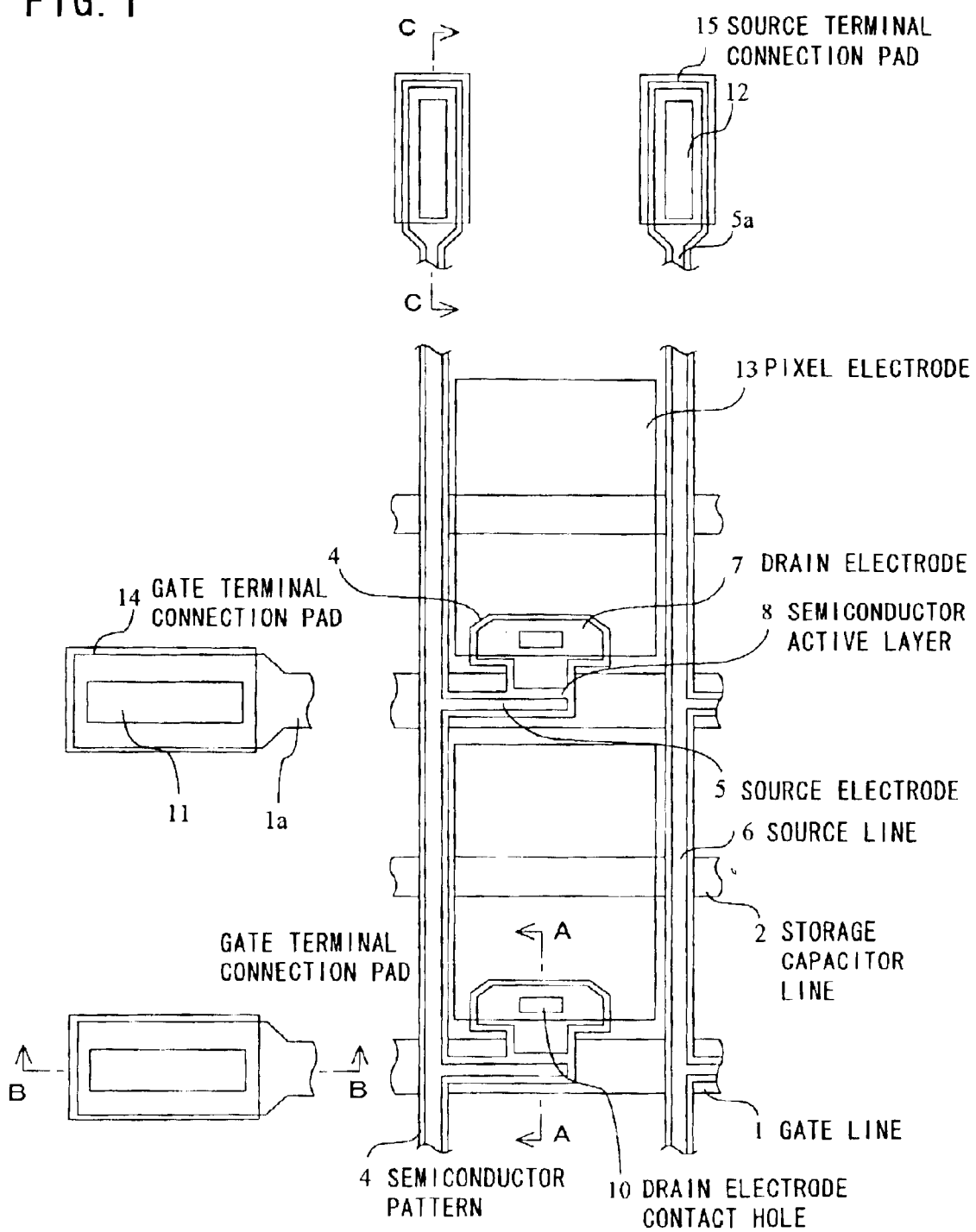

FIG. 7
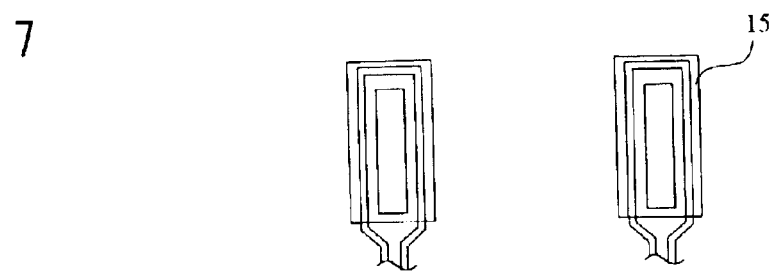
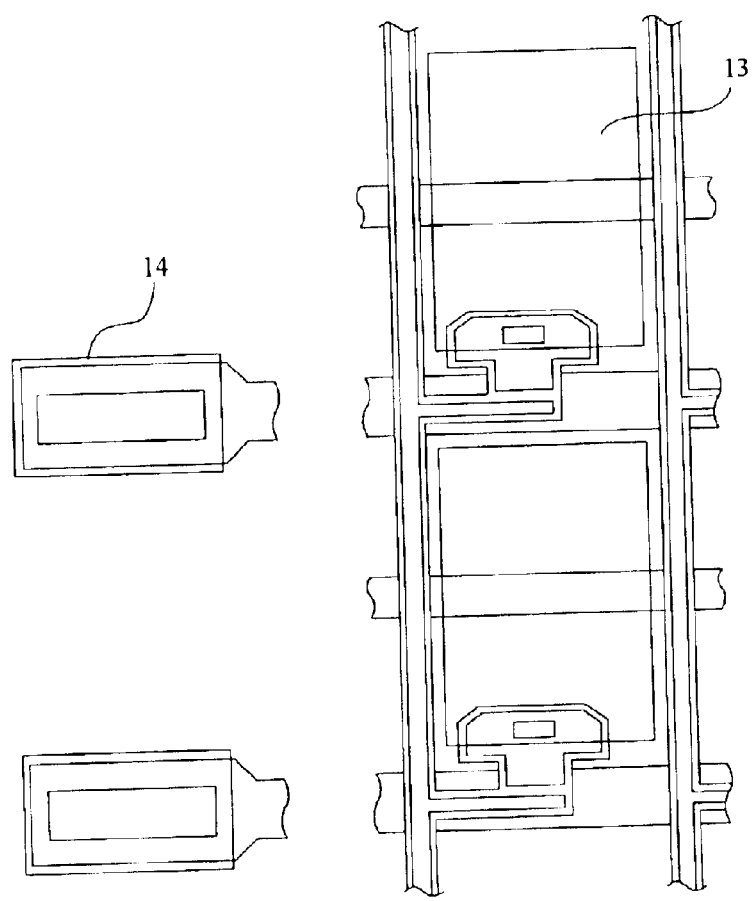
FIG. 8
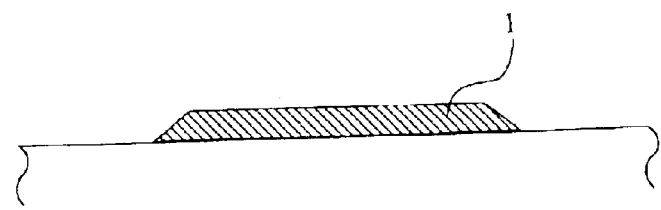

ASHING

SE ETCHING

Cr ETCHING

BACK CHANNEL ETCHING
+ RESIST STRIPPING

PROTRUSION AMOUNT OF
SEMICONDUCTOR LAYER - SMALL

SE ETCHING

ASHING

Cr ETCHING

BACK CHANNEL ETCHING + RESIST STRIPPING

PROTRUSION AMOUNT OF SEMICONDUCTOR LAYER - LARGE

THIN FILM TRANSISTOR ARRAY, FABRICATION METHOD THEREOF, AND LIQUID CRYSTAL DISPLAY DEVICE EMPLOYING THE SAME

BACKGROUND OF THE INVENTION

1. Field of the Invention

The present invention relates to a thin film transistor array substrate and fabrication method thereof, and relates to a thin film transistor substrate employed in a liquid crystal display device, for example.

2. Related Background Art

The application of electrical optical elements employing liquid crystals to displays has been the subject of active research. Of these elements, TFT-LCDs which employ thin film transistors (referred to below as TFTs) as switching elements are superior in terms of portability, low electrical power consumption and display quality, and are therefore widely used. In order to attain more widespread usage, further cost reductions are required. As one measure for achieving further cost reductions, the reduction of the number of TFT array fabrication steps for increased productivity has been investigated.

An attempt to eliminate photolithography processes, that is, masks, is illustrated in Japanese Patent Laid-open application No. 2000-111958. A cross-sectional view of a pixel section of a TFT array substrate fabricated by four photolithography processes is shown in FIG. 2A, and the description will be provided using this cross-sectional view.

In this prior art example, after an electrically conductive film with a thickness on the order of 100 nm has been deposited on a transparent substrate, a resist pattern is formed using a first mask in a first photolithography process and gate line 1 is then formed by etching. Next, a gate insulation film 3, a semiconductor layer 4a, and an ohmic layer 4b (described as a 'contact layer' in Japanese Patent Laid-open application No. 2000-111958) are deposited on the transparent substrate on which the gate line 1 is formed so as to have the respective thicknesses 150 to 500 nm, 50 to 150 nm, and 30 to 60 nm. A metal film 16 is then deposited in a thickness of 150 to 300 nm.

In a second photolithography process, a second mask is used to form a resist pattern 17 (described as a 'photosensitive film' in Japanese Patent Laid-open application No. 2000-111958) thickly on a source electrode 5, source line 6 (described as 'data wire' in Japanese Patent Laid-open application No. 2000-111958), and a drain electrode 7, and thinly in the corresponding section to a semiconductor active layer 8 (described as a 'channel section' in Japanese Patent Laid-open application No. 2000-111958). The thick resist pattern on the source electrode 5, source line 6, and drain electrode 7 will be referred to below as the 'normal film thickness resist pattern 17a, and the thin resist pattern in the corresponding section to the semiconductor active layer 8 will be referred to below as the thin film resist pattern 17b. The metal film is then removed by wet etching or similar. Thereafter, the thin film resist pattern 17b, the ohmic layer 4b, and the semiconductor layer 4a which lies beneath the ohmic layer 4b are removed at the same time by dry etching. As a result of this processing, the metal film 16 is exposed in the corresponding section to the semiconductor active layer 8. Then, the metal film 16 in the corresponding section to the semiconductor active layer 8 is removed by wet etching to expose the ohmic layer 4b beneath the metal film 16. In addition, part of the semiconductor layer 4a and of the ohmic layer 4b of the corresponding section to the semiconductor active layer 8 are removed by dry etching, whereupon the resist is stripped away. Then SiNx, which constitutes an intermediate insulation film 9, is stacked with a thickness of 300 nm or more. In a third photolithography process, patterning is carried out using a third mask, and the intermediate insulation film 9, and the gate insulation film are then etched. An electrically conductive layer of 40 to 50 nm is also stacked. Ultimately, in a fourth photolithography process, patterning is carried out using a fourth mask and the electrically conductive film is etched, thereby completing the TFT. In the above fabrication method, a reduction of the number of masks is achieved by varying the thickness of the resist of the second mask according to location.

In the fabrication process for a TFT array substrate formed according to the prior art which is shown in FIGS. 16A to 16E, the details of the steps in the second photolithography process are shown. In the prior art illustrated by Japanese Patent Laid-open application No. 2000-111958, the thin film resist pattern 17b, the ohmic layer 4b, and the semiconductor layer 4a which lies beneath the ohmic layer 4b are removed at the same time by dry etching. Further, in the prior art shown in Japanese Patent Laid-open application No. 2001-339072, after the ohmic layer 4b and the semiconductor layer 4a are removed by dry etching, the thin film resist pattern 17b is removed by ashing.

FIG. 16A shows a structure of a TFT array substrate that pertains to a stage in which a resist pattern 17 which comprises the thick normal film thickness resist pattern 17a on the source electrode 5, the source line 6, and the drain electrode 7 and the thin film thickness resist pattern 17b in the corresponding section to the semiconductor active layer 8 is formed, and the metal film 16 is then removed by wet etching or similar. Here, the structure is such that the metal film 16 lies inwards from the ends of the resist pattern 17 as a result of side etching. FIG. 16B shows a structure of the TFT array substrate that pertains to a stage in which the ohmic layer 4b and the semiconductor layer 4a are removed by dry etching, which constitutes the next step. FIG. 16C shows a structure of the TFT array substrate that pertains to a stage in which the thin film resist pattern is removed by ashing, which constitutes the next step. FIG. 16D shows a structure of the TFT array substrate that pertains to a stage in which the metal film 16 in the corresponding section to the semiconductor active layer 8 is removed to expose the ohmic layer 4b beneath the metal film. FIG. 16E shows a structure of the TFT array substrate that pertains to a stage in which part of the semiconductor layer 4a and of the ohmic layer 4b of the corresponding section to the semiconductor active layer 8 is removed by dry etching before the resist is stripped away. At this stage, the source electrode 5, the drain electrode 7, and the semiconductor active layer 8 are exposed.

In the eighth embodiment example of the above-described Japanese Patent application Laid-open No. 2000-111958, following the formation of the resist pattern in the second photolithography process, etching of the metal film is carried out and then the thin resist, the ohmic layer and the semiconductor layer above the channel are removed at the same time. Further, according to Japanese Patent application Laid-open No. 2001-339072, after the ohmic layer and the semiconductor layer are removed by etching, the thin film resist pattern is removed by ashing. The following problems arise with such conventional technology.

Because the photosensitive material of the resist used by the second mask is viscous and fluid, the ends of the resist pattern are shaped with a taper angle. In cases where baking is performed in order to increase the bond strength between the metal film and the resist before the metal film is etched, this inclination becomes prominent. Hence, when the thin resist above the channel is removed, because sections of the thick resist are also tapered in other locations, the ends of the resist pattern are retracted to reduce the surface area of the resist pattern. The smaller the taper angle of the resist pattern, the greater the degree of this retraction.

On the other hand, because the semiconductor layer is removed prior to or at the same time as the removal of the thin film resist pattern, this layer is barely influenced by the area of the resist pattern, that is, by the taper angle of the same. Hence, following the removal of the thin film resist pattern, the pattern ends of the semiconductor layer protrude from the ends of the resist pattern. Even when the semiconductor layer and the thin film resist pattern are removed at the same time, although the ends of the semiconductor layer have a tapered shape, the protrusion from the ends of the resist pattern is similar. The width of this protrusion is determined by the thickness of the resist above the channel which is of reduced thickness and by the taper angle of the pattern ends.

Thereafter, when the metal film in the corresponding section to the semiconductor active layer is removed by etching, the structure is such that the ends of the metal film are contained on the inside of the ends of the resist as a result of side etching. Hence, the structure is such that the semiconductor layer protrudes significantly more than the metal film (the structure in FIG. 16E in which the semiconductor layer protrusion width W is large, for example).

The possibility exists that a TFT transistor array substrate that possesses such a structure will exhibit the characteristic of being extremely sensitive to fluctuations in the luminance due to the effect of the optical conductivity of the protruding semiconductor layer. There is therefore the problem that the TFT characteristics deteriorate due to optical radiation. For example, in cases where this TFT array substrate is used in a liquid crystal display device, when the luminance is made to fluctuate in order to attain an increase in the image quality, the stability of the image quality is severely affected.

SUMMARY OF THE INVENTION

It is accordingly an object of the present invention to provide a TFT array substrate and fabrication method thereof, and a liquid crystal display device employing the same which were conceived in order to solve such problems and whereby degradation of the TFT characteristics caused by optical radiation is suppressed.

A fabrication method of a TFT array substrate according to the present invention is a fabrication method of a thin film transistor array substrate having a step of forming a gate line on an insulating substrate; a step of forming a gate insulation film, a semiconductor layer, an ohmic layer, and a metal film on the insulating substrate on which the gate line is formed; a step of forming a pattern of a resist on the metal film by a photolithography process to cover at least a source line, a source electrode, a drain electrode, and a corresponding section to a semiconductor active layer of a thin film transistor which are to be formed on the ohmic layer in following steps, the resist being thinner on the corresponding section to the semiconductor active layer than on other sections; a step of etching the metal film to form the source line, the source electrode and the drain electrode; a step of making the resist thinner to remove the resist on the corresponding section to the semiconductor active layer; a step of removing the ohmic layer and the semiconductor layer of a section excluding the source line, the source electrode, the drain electrode, and the corresponding section to the semiconductor active layer by etching, after removing the resist on the corresponding section to the semiconductor active layer; a step of removing the metal film on the corresponding section to the semiconductor active layer by etching; and a step of removing the ohmic layer on the corresponding section to the semiconductor active layer by etching. This fabrication method makes it possible to fabricate a TFT array substrate whereby degradation of the TFT characteristics which is caused by optical radiation is suppressed.

Another fabrication method of a TFT array substrate according to the present invention is a fabrication method of a thin film transistor array substrate having a step of forming a gate line on an insulating substrate; a step of forming a gate insulation film, a semiconductor layer, an ohmic layer, and a metal film on the insulating substrate on which the gate line is formed; a step of forming a pattern of a resist on the metal film by a photolithography process to cover at least a source line, a source electrode, a drain electrode, and a corresponding section to a semiconductor active layer of a thin film transistor which are to be formed on the ohmic layer in following steps, the resist being thinner on the corresponding section to the semiconductor active layer than on the other sections; a step of etching the metal film to form the source line, the source electrode and the drain electrode; a step of making the resist thinner to remove the resist on the corresponding section to the semiconductor active layer; a step of removing the ohmic layer and the semiconductor layer of a section excluding the source line, the source electrode, the drain electrode, and the corresponding section to the semiconductor active layer by etching, after removing the resist on the corresponding section to the semiconductor active layer; a step of removing the metal film on the corresponding section to the semiconductor active layer by etching; a step of removing the ohmic layer on the corresponding section to the semiconductor active layer by etching; a step of forming an intermediate insulation film; a step of forming a drain electrode contact hole leading to the drain electrode, a source terminal contact hole leading to the source electrode, and a gate terminal contact hole leading to the gate line, in the gate insulation film and the intermediate insulation film by a third photolithography process and etching; a step of forming a conductive film; and a step of forming a pixel electrode covering the drain electrode contact hole, the source terminal contact hole, and the gate terminal contact hole, by a fourth photolithography process and etching. This fabrication method makes it possible to fabricate a TFT array substrate whereby degradation of the TFT characteristics which is caused by optical radiation is suppressed in four photolithography processes.

It is preferable to perform side etching in the step of etching the metal film to form the source line, the source electrode, and the drain electrode. This fabrication method produces a TFT array substrate whereby degradation of the TFT characteristics is suppressed.

It is further preferable that the metal film is removed by 0.5 μm to 1.3 μm by the side etching. This fabrication method produces a TFT array substrate whereby degradation of the TFT characteristics is further suppressed.

Use of a half-tone mask is preferable in photolithography for formation of the resist pattern being thinner on the corresponding section to the semiconductor active layer than on the other sections. It allows to produce a TFT array substrate in four photolithography processes.

Use of a plurality of masks is also preferable in photolithography for the formation of the resist pattern being thinner on the corresponding section to the semiconductor active layer than on the other sections. It allows to produce a TFT array substrate in four photolithography processes.

It is preferable in the formation of the resist pattern being thinner on the corresponding section to the semiconductor active layer than on the other sections that the resist is removed so that ends of the resist pattern are substantially aligned with ends of the metal film.

The source line, the source electrode, and the drain electrode can be made of a metal selected from the group consisting of Cr, Mo, Ti, W, Al and an alloy mainly comprising at least one of the metals.

RIE mode is preferable for ashing to remove the resist on the corresponding section to the semiconductor active layer in order to improve productivity.

It is possible to provide a thin film transistor array substrate whereby degradation of the TFT characteristics is suppressed by the above fabrication method.

The above thin film transistor array substrate is preferably used in a liquid crystal display device. It is thus possible to provide a liquid crystal display device whose image quality is stabile when the luminance is made to fluctuate.

The present invention will become more fully understood from the detailed description given hereinbelow and the accompanying drawings which are given by way of illustration only, and thus are not to be considered as limiting the present invention.

BRIEF DESCRIPTION OF THE DRAWINGS

FIG. 1 is a plan view of thin film transistor array substrate according to the present invention.

FIG. 7 is a plan view of the thin film transistor array substrate according to the present invention in course of fabrication.

FIG. 8 is a cross-sectional view along line A—A in FIG. 1 of the thin film transistor array substrate according to the present invention in course of fabrication.

DESCRIPTION OF THE PREFERRED EMBODIMENTS

Figure 2A:
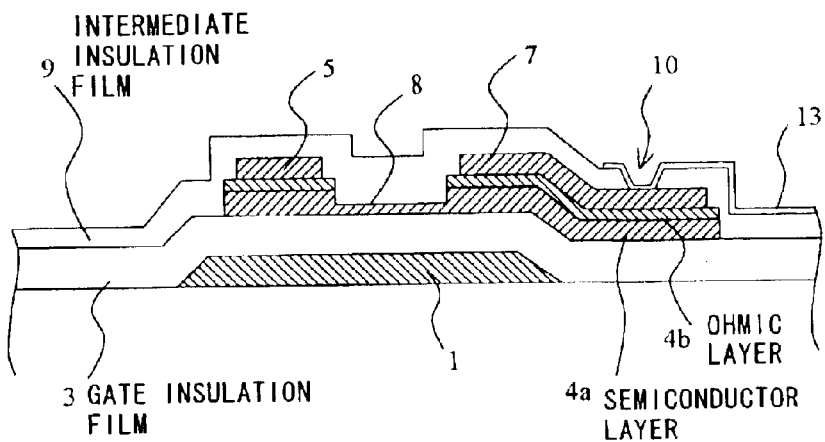
FIGS. 2A, 2B, and 2C are cross-sectional views along line A—A, line B—B, and C—C in FIG. 1, respectively.
Figure 2B:
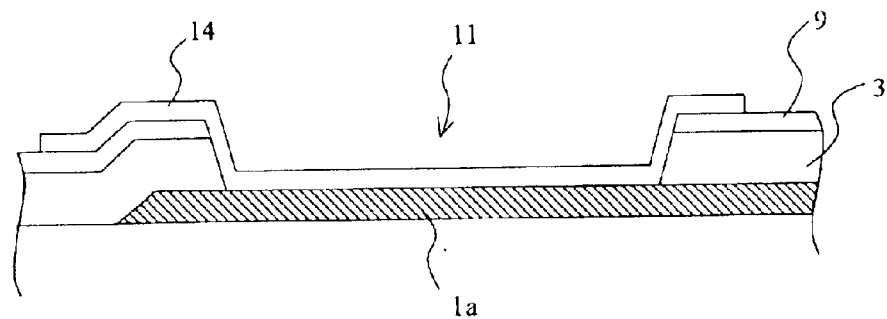
Figure 2C:
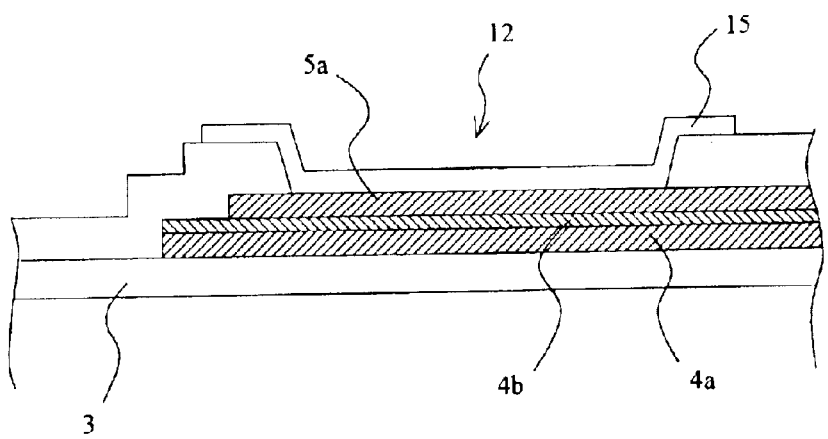

FIGS. 1 and 2 show a TFT array substrate fabricated according to an embodiment of the present invention. FIG. 1 is a planar view, while FIG. 2A is a cross-sectional view along the line A—A in FIG. 1, FIG. 2B is a cross-sectional view along the line B—B in FIG. 1, and FIG. 2C is a cross-sectional view along the line C—C in FIG. 1. In FIGS. 1 and 2, 1 is gate line, 1a is a gate terminal metal pad, 2 is storage capacitor line, 3 is a gate insulation film, 4 is a semiconductor pattern, 4a is a semiconductor layer (semiconductor active film), 4b is an ohmic layer (ohmic contact film), 5 is a source electrode, 5a is a source terminal metal pad, 6 is source line, 7 is a drain electrode, 8 is the semiconductor active layer of the thin film transistor, 9 is an intermediate insulation film, 10 is a drain electrode contact hole, 11 is a gate terminal contact hole, 12 is a source terminal contact hole, 13 is a pixel electrode, 14 is a gate terminal connection pad, and 15 is a source terminal connection pad.

Figure 3:
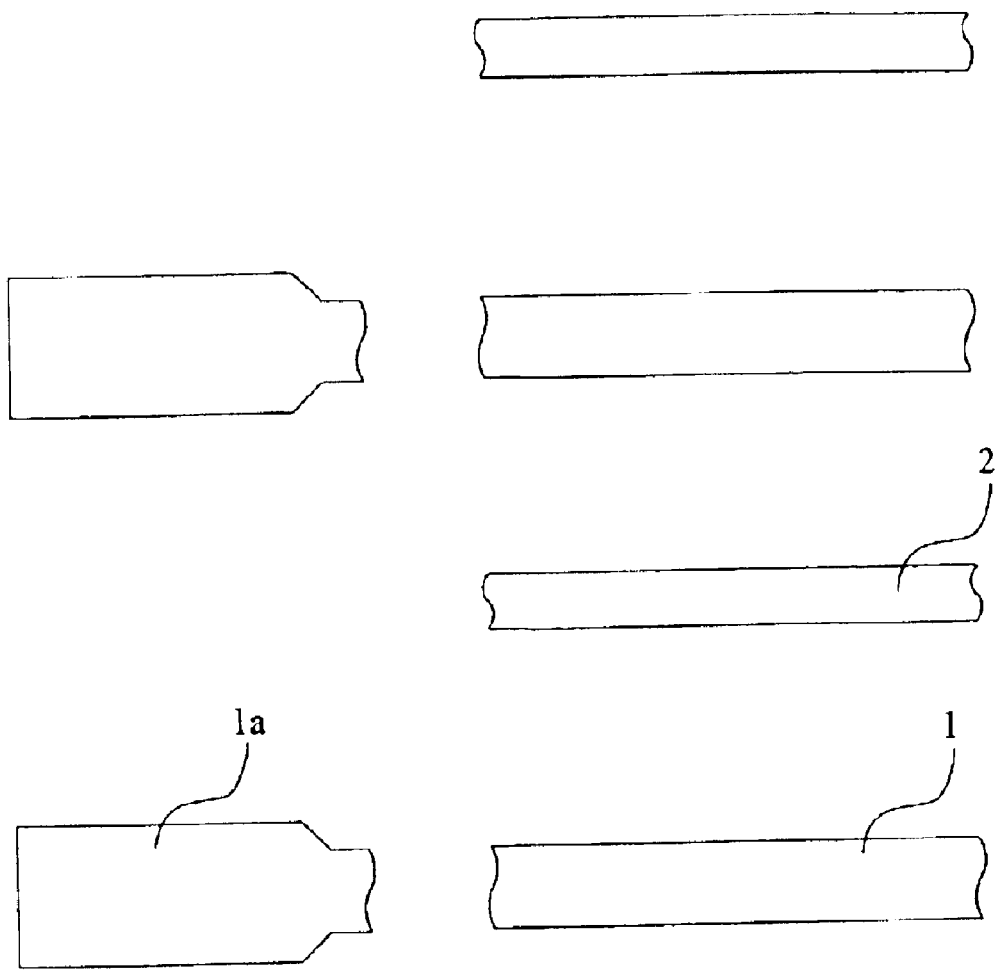
FIG. 3 is a plan view of the thin film transistor array substrate according to the present invention in course of fabrication.
Figure 9:
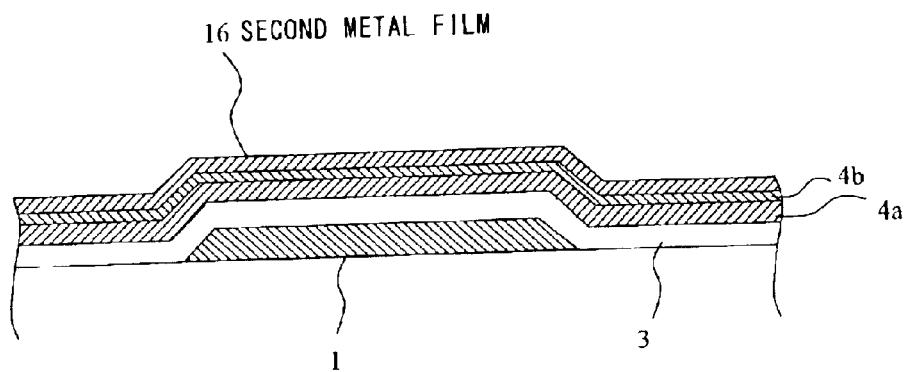
FIG. 9 is a cross-sectional view along line A—A in FIG. 1 of the thin film transistor array substrate according to the present invention in course of fabrication.

A description will be provided next for a specific fabrication method. FIGS. 3 to 7 are planar views of individual steps and FIGS. 8 to 14 show cross-sections of a part which corresponds to the cross-section along the line A—A in FIG. 1 that show individual steps. First, an electrically conductive film of Cr, Mo, Ti, W, Al, or similar, is formed on the transparent insulating substrate in a thickness on the order of 400 nm. Next, in a first photolithography process, the electrically conductive film is patterned to form the gate line 1, gate terminal metal pad 1a, and storage capacitor line 2 which are shown in FIGS. 3 and 8. Here, when the electrically conductive film is made of Cr, the same is processed by means of wet etching using a $(NH_4)_2[Ce(NO_3)_6]+HNO_3+H_2O$ solution, for example. Next, films are formed on the insulating substrate whereon the electrically conductive film is patterned, as shown in FIG. 9. These films include a $SiN_x$ film for the gate insulation film 3, an a-Si film for the semiconductor active film 4a, an $n^+$a-Si film for the ohmic contact film 4b, and a Cr film for the metal film 16, and these films are stacked with a film thickness of approximately 400 nm, 150 nm, 30 nm, and 400 nm respectively. The $SiN_x$, a-Si, and $n^+$a-Si films are deposited using a plasma CVD device. During the ohmic layer deposition, $n^+$a-Si is formed by doping with $PH_3$. The Cr deposition is performed using a DC magnetron sputtering device.

Figure 4:
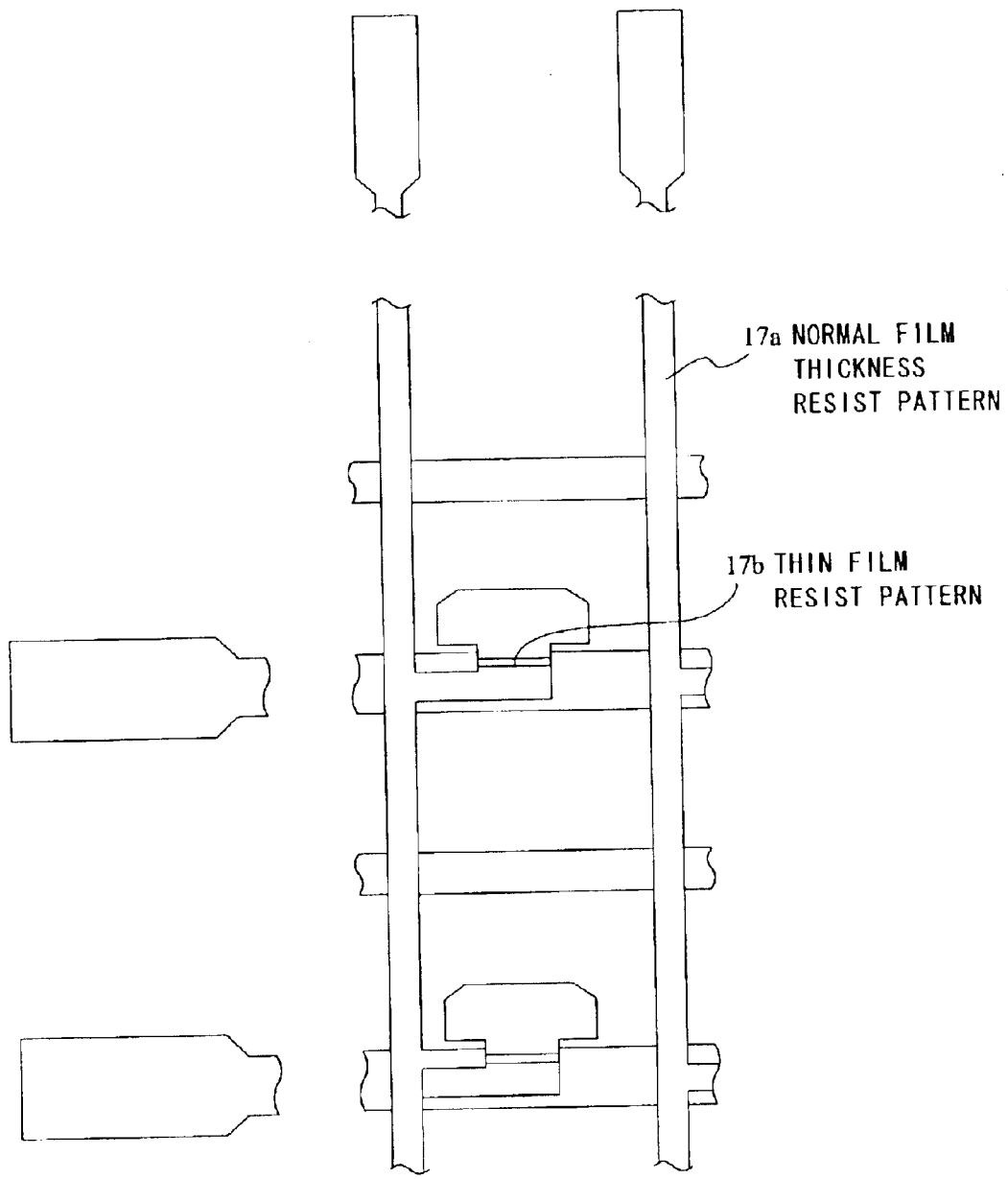
FIG. 4 is a plan view of the thin film transistor array substrate according to the present invention in course of fabrication.
Figure 5:
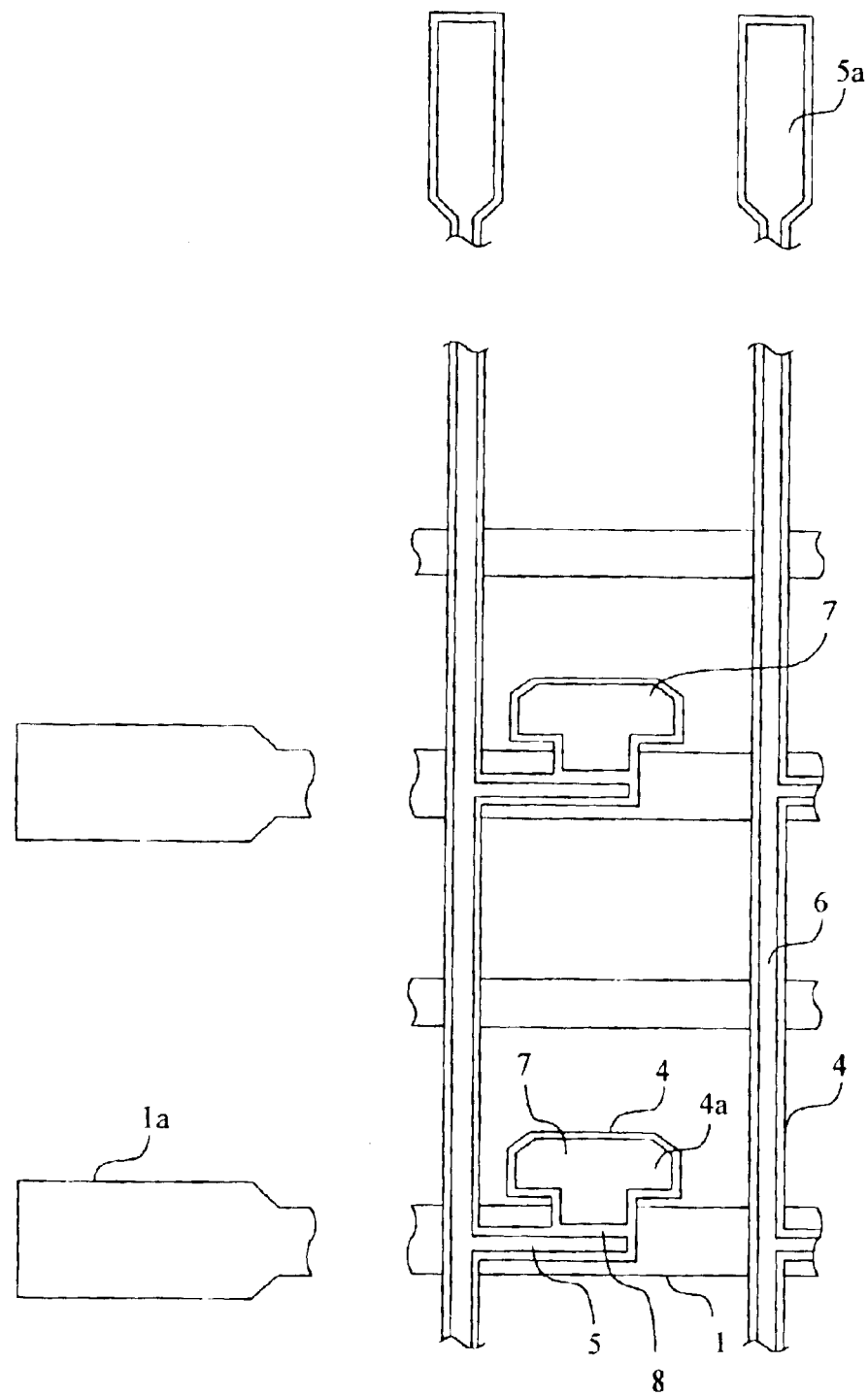
FIG. 5 is a plan view of the thin film transistor array substrate according to the present invention in course of fabrication.
Figure 10:
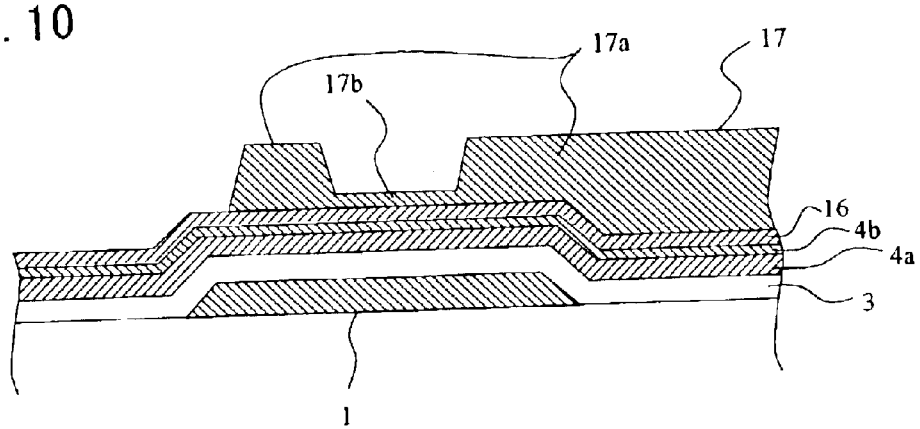
FIG. 10 is a cross-sectional view along line A—A in FIG. 1 of the thin film transistor array substrate according to the present invention in course of fabrication.
Figure 11:
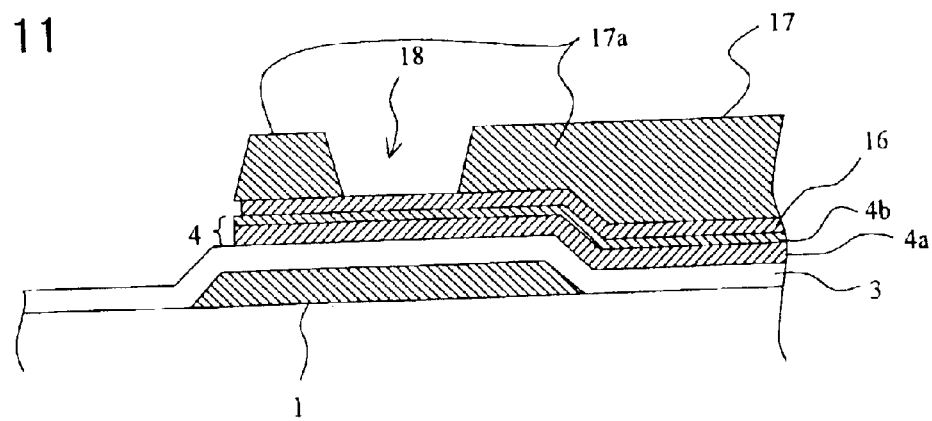
FIG. 11 is a cross-sectional view along line A—A in FIG. 1 of the thin film transistor array substrate according to the present invention in course of fabrication.
Figure 12:
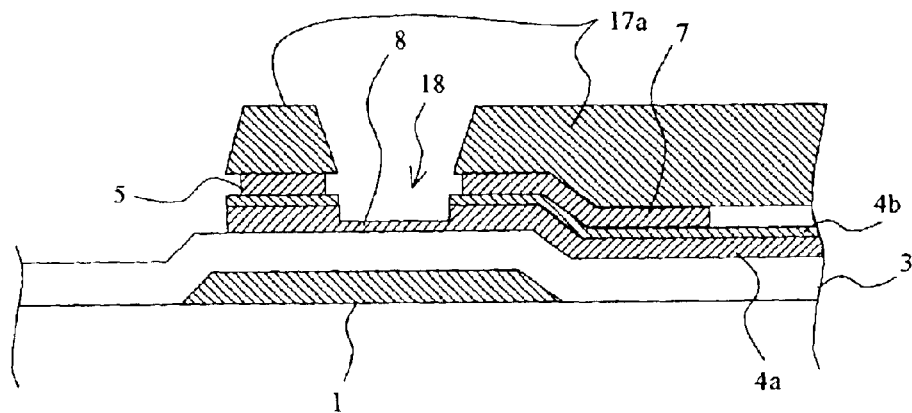
FIG. 12 is a cross-sectional view along line A—A in FIG. 1 of the thin film transistor array substrate according to the present invention in course of fabrication.

Next, in a second photolithography process, a normal film thickness resist pattern 17a for the formation of the source electrode 5, the source terminal metal pad 5a, the source line 6, and the drain electrode 7 is formed along with a thin film resist pattern 17b for the formation of the semiconductor active layer 8 of the thin film transistor, as shown in FIG. 4. Here, a Novolak resin positive resist is employed as the resist, and the application of the resist is performed by spin coating to a thickness 1.5 μm. Following the application of the resist, pre-baking is carried out for 90 seconds at 120° C., whereupon exposure is performed for 1000 msec with a mask pattern that does not expose the normal film thickness resist pattern 17a and the thin film resist pattern 17b. Then additional exposure for 400 msec is performed using a mask pattern which permits exposure of parts other than the normal film thickness resist pattern 17a. Because two-stage exposure is performed, the film thickness of the normal film thickness resist pattern 17a and that of the thin film resist pattern 17b are different. The exposure apparatus is a stepper- or mirror projection-type exposure apparatus and the light sources used are g and h rays of a high pressure mercury lamp. Next, following development using an organic alkali-based developer, a post-baking process is performed for 180 seconds at between 100° C. and 120° C. to increase the bond strength between the resist and the Cr while volatilizing the solvent in the resist. As a result of such processes, the TFT resist is shaped having a different film thickness as shown in FIG. 10. Here, the resist film thickness of the normal film thickness resist pattern 17a is on the order of 1.4 μm, while the resist film thickness of the thin film resist pattern 17b is on the order of 0.4 μm.

Thereafter, an oven-baking process is also carried out at between 120° C. and 130° C. to further increase the bond strength between the resist and the Cr. Here, care is required because when the baking temperature is too high, sagging of the resist end faces occurs. Thereafter, etching of the metal film 16 is performed and parts other than those which correspond to the source electrode 5, source line 6, and source terminal metal pad 5a, and drain electrode 7 are removed. When the metal film 16 is a Cr film, the same is processed by wet etching using a $(NH_4)_2[Ce(NO_3)_6]+HNO_3+H_2O$ solution, for example. The metal film 16 is then shaped so as to lie further inwards than the resist pattern 17 by means of side etching.

Thereafter, the thin film resist pattern 17b is removed by ashing using plasma oxide so as to expose the metal film 16 below the thin film resist pattern 17b. In the present embodiment, ashing is carried out for 60 seconds at a pressure of 40 Pa. Further, during ashing, RIE mode makes it easier to control the size of the resist aperture denoted by 18 in FIG. 11 than PE mode. This is because anisotropy and uniformity are more favorable in RIE mode. In addition, compared with PE mode, there is the advantage with the RIE mode that the resist removal speed can be raised. In this ashing process, the ends of the resist pattern 17 and the ends of the metal film 16 are desirably substantially equal. Next, the ohmic layer 4b and semiconductor layer 4a of a section that excludes the normal film thickness resist pattern 17a and the thin film resist pattern 17b are removed by dry etching to form the semiconductor pattern 4. This etching is referred to as 'SE etching'. Such a fabrication step results in the structure shown in FIG. 11.

Further, after performing oven-baking at between 130° C. and 140° C., the metal film 16 of the corresponding section to the exposed semiconductor active layer 8 is removed by etching. The amount of overetching is desirably approximately 50%. Thereafter, part of the semiconductor layer 4a and of the ohmic film 4b at the resist pattern aperture 18 is removed by etching. In the present embodiment, part of the semiconductor layer 4a and of the ohmic layer 4b are removed to approximately 100 nm in total by etching using $HCl+SF_6+He$ gas. This etching is known as a 'back channel etch'. Such a fabrication step results in the shape shown in FIG. 12. Then, when the resist is stripped away, the semiconductor pattern 4, the source electrode 5, the source line 6, the drain electrode 7, the source terminal metal pad 5a, and the semiconductor active layer 8 are exposed, which results in the structure shown in FIG. 5.

Figure 15A:
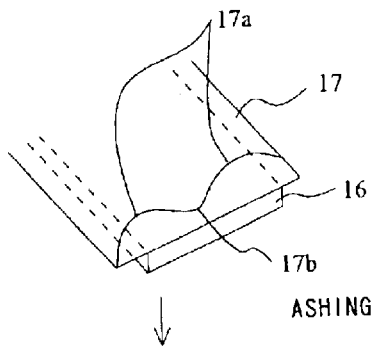
FIGS. 15A to 15E are step diagrams to illustrate fabrication processes of the thin film transistor array substrate according to the present invention.
Figure 15B:
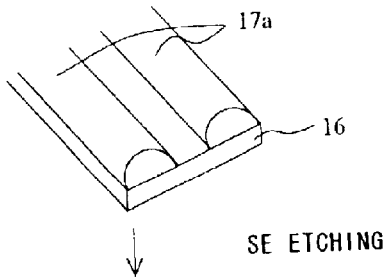
Figure 15C:
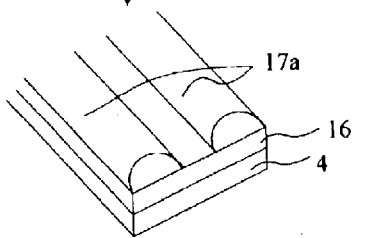
Figure 15D:
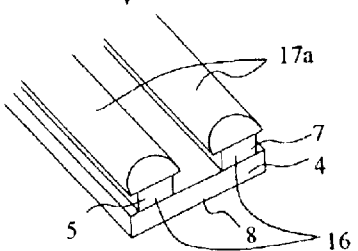
Figure 15E:
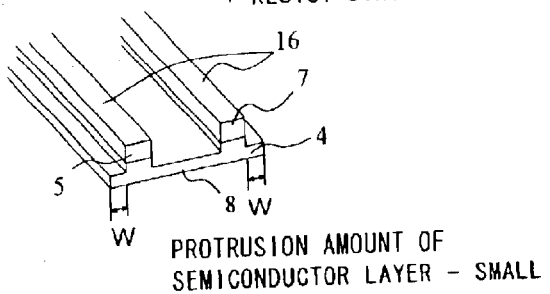

The details of the fabrication process steps that succeed the second photolithography process are shown in FIGS. 15A to 15E. FIG. 15A shows a structure of a TFT array substrate that pertains to a stage in which the thick normal film thickness resist pattern 17a is formed on the source electrode 5, the source line 6, and the drain electrode 7, and the thin film thickness resist pattern 17b is formed in the corresponding section to the semiconductor active layer 8, and then the metal film 16 is removed by etching in such a way that the metal film 16 lies inside the resist ends. FIG. 15B shows a structure of the TFT array substrate that pertains to the next stage in which the thin film resist pattern 17b is removed by ashing. Here, the resist on the corresponding section to the semiconductor active layer 8 is removed by ashing and the ends of the resist pattern are cut away in the transverse direction thereof to reduce the area of the resist pattern. FIG. 15C shows a structure of the TFT array substrate that pertains to the next stage in which SE etching is performed. The ends of the semiconductor layer 4 and metal film 16 are substantially aligned by means of SE etching. FIG. 15D shows a structure of the TFT array substrate that pertains to the next stage in which the metal film 16 of the corresponding section to the semiconductor active layer undergoes etching. The source electrode 5 and drain electrode 7 are formed as a result of this etching. Here, the metal film 16 is shaped in such a way that the metal film 16 lies on the inside of the resist pattern 17a as a result of side etching. FIG. 15E shows a structure of the TFT array substrate that pertains to the next stage in which a back channel etch is carried out and the resist is stripped away. As a result of stripping away the resist, the source electrode 5 and drain electrode 7 are exposed, and some of the semiconductor pattern 4 is etched such that the semiconductor active layer 8 is exposed.

According to the present embodiment, because the thin film resist pattern is removed before the semiconductor pattern 4, the region of the etched semiconductor pattern 4 is wider than in the prior art, and the protrusion amount W shown in FIG. 15E is smaller. This fabrication method therefore makes it possible to fabricate a TFT array substrate whereby degradation of the TFT characteristics which is caused by optical radiation is suppressed.

Figure 6:
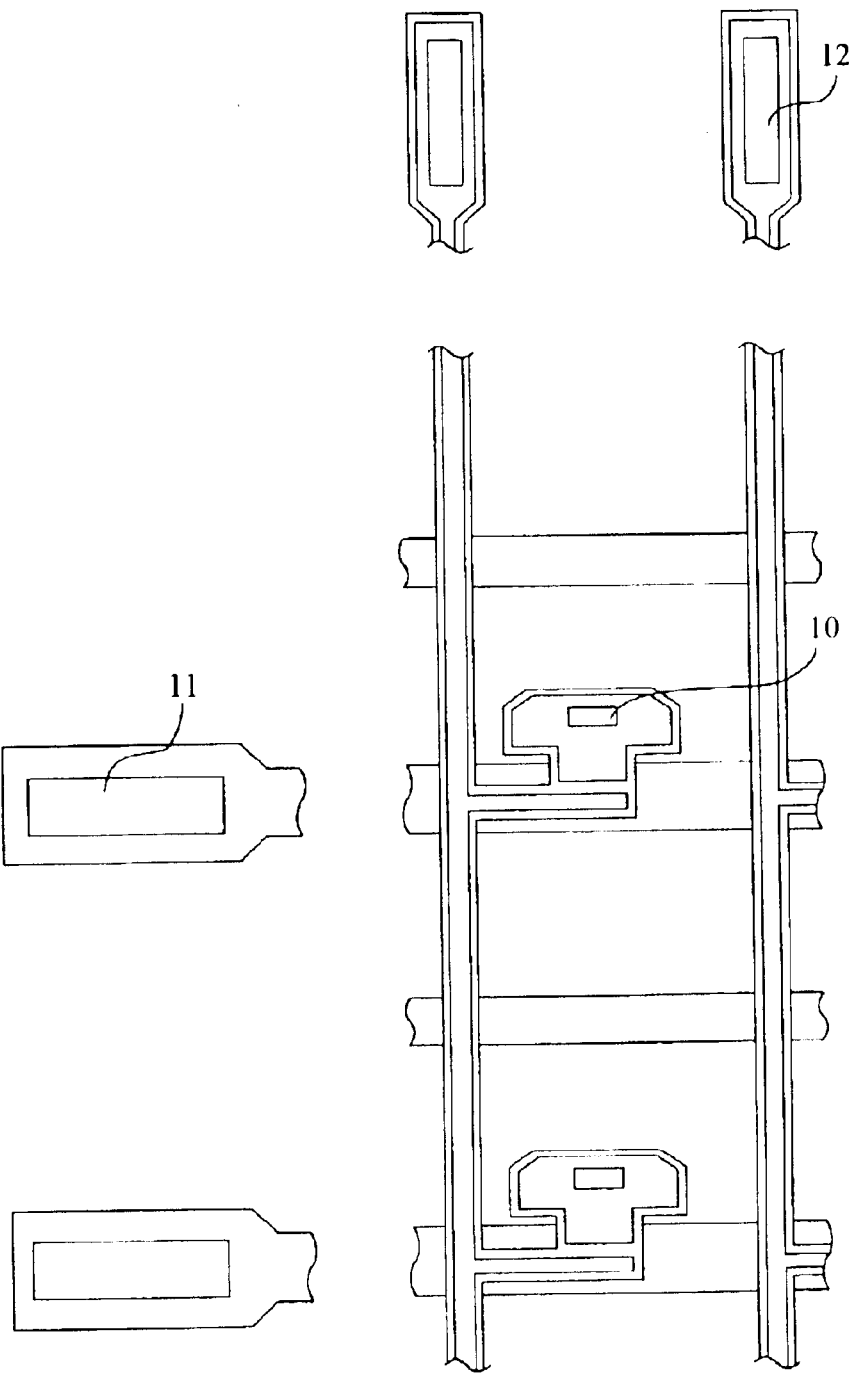
FIG. 6 is a plan view of the thin film transistor array substrate according to the present invention in course of fabrication.
Figure 13:
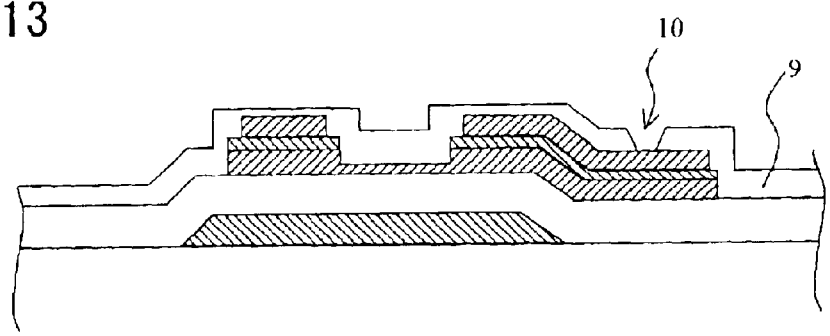
FIG. 13 is a cross-sectional view along line A—A in FIG. 1 of the thin film transistor array substrate according to the present invention in course of fabrication.
Figure 14:
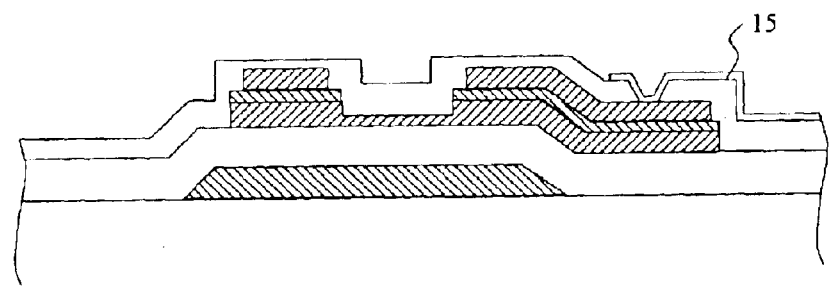
FIG. 14 is a cross-sectional view along line A—A in FIG. 1 of the thin film transistor array substrate according to the present invention in course of fabrication.

Thereafter, SiNx, which constitutes an intermediate insulation film 9, is formed with a thickness of 300 nm using a PCVD device. This intermediate insulation film 9 is patterned in a third photolithography process. Then, by etching the intermediate insulation film 9 and the gate insulation film 3, a drain electrode contact hole 10 which leads to the drain electrode 7 shown in FIGS. 2A, 6 and 13 is formed. A gate terminal contact hole 11 that leads to the gate terminal metal pad 1a shown in FIGS. 2B and 6 is also formed. A source terminal contact hole 12 that leads to the source terminal metal pad 5a in FIGS. 2C and 6 is also formed. In the present embodiment, the $SiN_x$, constituting the intermediate insulation film 9 and the gate insulation film 3 is removed by dry etching using $CF_{4+O2}$. A transparent conductive film 19 is also deposited and implanted in the drain electrode contact hole 10, the gate terminal contact hole 11 and the source terminal contact hole 12 so as to make contact with the drain electrode 7, the gate terminal metal pad 1a, and the source terminal metal pad 5a respectively. In the present embodiment, the transparent conductive film 19 is an ITO film with a film thickness of approximately 100 nm and is deposited using a DC magnetron sputtering device. Next, the transparent conductive film 19 is patterned in a fourth photolithography process. Then, a transparent pixel electrode 13, a gate terminal connection pad 14 and a source terminal connection pad 15 are formed by etching. In the present embodiment, the ITO film is removed by wet etching using an $HCl+HNO_3+H_2O$ solution. The result is the structure shown in FIG. 7.

By means of the above fabrication method, a TFT array substrate can be fabricated in four photolithography processes. Further, because, in a structure which is fabricated in this manner, there is no difference in level with respect to the semiconductor layer 4 below the source line 6, this source line 6 is not easily broken. Also, because the patterns of the source electrode 5 and the drain electrode 7 are contained on the inside of the semiconductor layer 4a and do not intersect, the TFT leakage current can also be kept low. Further, due to the fact that the protrusion amount W of the semiconductor layer 4a from the metal film 16 is small, it is possible to prevent degradation of the TFT characteristics caused by optical radiation. In addition, because the metal film 16 is formed from Cr, corrosion of the source line and the like caused by the etchant for the transparent conductive film 19 can be prevented. It is therefore possible to raise the yield still further.

In the above second photolithography process, photolithography can be carried out using a half-tone mask in the step of forming the normal film thickness resist pattern and the thin film resist pattern which have different film thicknesses. For example, when a negative resist is used, photolithography can be performed through exposure using a photomask (referred to as a 'half-tone mask') that comprises a transparent section over a part that corresponds to the normal film thickness resist pattern 17a, a semi-transparent section over a part that corresponds to the thin film resist pattern 17b, and a light-shielding section over all other parts. Further, when a positive resist is used, exposure is performed using a 'half-tone mask' that comprises a light-shielding section over a part that corresponds to the normal film thickness resist pattern 17a, a semi-transparent section over a part that corresponds to the thin film resist pattern 17b, and a transparent section over all other parts. It is thus possible to form a resist pattern of varying film thickness by means of a single photolithography process, and the TFT array substrate can therefore be fabricated in four photolithography processes.

Further, in the second photolithography process, photolithography can be carried out using two masks in the step of forming the normal film thickness resist pattern 17a and the thin film resist pattern 17b which have different film thicknesses. For example, when a negative resist is used, photolithography can be performed through exposure using two masks, namely a first photomask that comprises a transparent section over a part that corresponds to the normal film thickness resist pattern 17a, and a light-shielding section over the other parts that include a part that corresponds to the thin film resist pattern 17b, and a second photomask that comprises a transparent section over parts that correspond to the normal film thickness resist pattern 17a and the thin film resist pattern 17b, and a light-shielding section over all the other parts. Also, when a positive resist is used, exposure is performed using two masks, namely a first photomask that comprises a light-shielding section over a part that corresponds to the normal film thickness resist pattern 17a and a transparent section over the other parts that include a part that corresponds to the thin film resist pattern 17b, and a second photomask that comprises a light-shielding section over a part that corresponds to the normal film thickness resist pattern 17a and the thin film resist pattern 17b, and a transparent section over all the other parts. It is thus possible to form a resist pattern of varying film thickness by means of a single photolithography process, and the TFT array substrate can therefore be fabricated in four photolithography processes.

The above-described metal film 16 is etched, the same desirably undergoing side-etching in an etching step that excludes the source electrode 5, the source line 6, the drain electrode 7, and the corresponding section to the semiconductor layer 8. In other words, as shown in FIG. 15A, the metal film 16 is formed inside the ends of the resist pattern 17. As a result, because there is no difference in level between the semiconductor layer 4 and the source line 6, the source line 6 is not easily broken. Also, because the patterns of the source electrode 5 and the drain electrode 7 are contained on the inside of the semiconductor layer 4 and do not intersect, the TFT leakage current can also be kept low. In addition, the side etching amount is desirably such that the distance of the metal film 16 from the ends of the resist pattern 17 is 0.5 $\mu$m to 1.3 $\mu$m. In this structure, because the protrusion amount W is small, a TFT array substrate that exhibits more favorable TFT characteristics can be fabricated.

Further, in the above-described step of removing the thin film resist pattern 17b by ashing, the ends of the normal film thickness resist pattern 17a are desirably formed so as to be substantially aligned to the ends of the metal film 16 which is side-etched such that the ends of the metal film 16 are recessed. As a result, the semiconductor-layer protrusion amount W is reduced and it is thus possible to fabricate a TFT array substrate with more favorable TFT characteristics.

In the present embodiment, Cr is employed for the metal film but Al, Ti, Mo, W, or Ta could also be used or indeed an alloy containing at least one of these metals. Further, the metal film may have a multi-layer structure containing such metals and nitride films of these metals, i.e. a three-layered structure such as AlN/Al/AlN, for example. As a result of such a structure, the formation of the source electrode 5, source line 6, and drain electrode 7, and the formation of the semiconductor active layer 8 is also possible by means of a single etching step, and etching of the metal film 16 can be performed in a total of two etching steps. The fabrication steps can thus be simplified and productivity can therefore be raised. A multi-layer structure could also be formed using two or more kinds of these metals. For example, a two-layer structure such as Al/Mo and a three-layer structure such as Cr/Al/Cr are also feasible. Furthermore, plasma oxide is used during ashing here but a fluorine-containing gas such as $CF_4$ and $SF_6$ or similar could also be added to the oxide gas. Here, there are advantages such as increased productivity because the resist removal speed during ashing can be raised.

Specific protrusion amounts for the semiconductor layer 4a which pertain to the present embodiment and to the prior art are shown in Table 1. Case 1 pertains to the present embodiment and the side etching amount of the stage that involves performing etching that excludes the source electrode 5, the source line 6, the drain electrode 7, and the corresponding section to the semiconductor active layer 8 (the stage in FIG. 15A) is 200 nm. Case 2 pertains to the present embodiment and involves overetching in which the amount of side etching of the metal film 16 in the same stage (the stage in FIG. 15A) is 1000 nm. Case 3 pertains to the prior art and the amount of side etching of the metal film 16 in the same stage (the stage in FIG. 16A) is 200 nm. Here, the metal film 16 is Cr and has a film thickness of 200 nm. Further, the Cr is etched such that the amount of side etching of the stage of forming the semiconductor active layer 8 (the stage in FIG. 15D or 16D) is 200 nm, the amount of retraction of the resist pattern 17 in the transverse direction thereof as a result of ashing is 1000 nm, and the amount of cutaway in the perpendicular direction is 800 nm.

TABLE 1

Protrusion amount W

| | Protrusion amount W |
|---|---|
| Case 1: Present embodiment Side etching amount: 200 nm | 1000 nm |
| Case 2: Present embodiment Side etching amount: 1000 nm | 200 nm |
| Case 3: Prior art Side etching amount: 200 nm | 1200 nm |

Figure 17:
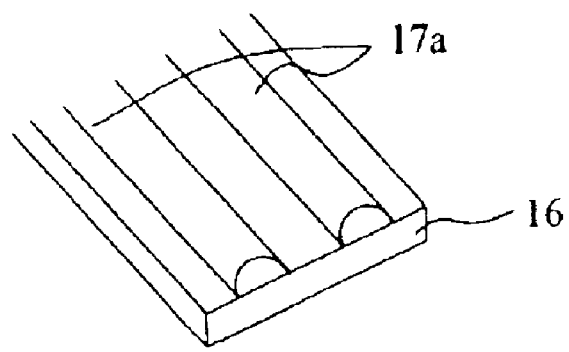
FIG. 17 is an enlarged view of a TFT section of the thin film transistor array substrate according to the present invention in course of fabrication.

In Case 1, the amount of Cr side etching of the stage in FIG. 15A is 200 nm. Because, in the ashing that follows, the resist pattern 17 is retracted by 1000 nm in the transverse direction thereof, the ends of the Cr protrude 800 nm beyond the ends of the resist pattern, as shown in FIG. 17. Thereafter, SE etching is performed such that the ends of the Cr film and the semiconductor pattern 4 are made substantially equal. Next, etching of the Cr of the corresponding section to the semiconductor active layer 8 takes place, and the amount of retraction of the Cr in the transverse direction thereof is 1000 nm in total on account of the 800 nm protrusion from the resist pattern 17 and the 200 nm afforded by side etching. Because there is a resist above the protruding parts, etching is not performed in a back channel etch. Hence, the protrusion amount 1000 nm becomes the protrusion amount W of the semiconductor layer 4a.

In Case 2, the amount of Cr side etching of the stage in FIG. 15A is 1000 nm. Because, in the ashing that follows, the resist pattern 17 is retracted by 1000 nm in the transverse direction thereof, the ends of the Cr and the ends of the resist pattern are substantially equal, as shown in FIG. 15B. Next, etching of the Cr of the corresponding section to the semiconductor active layer 8 takes place, and the amount of side etching, which is 200 nm, is the protrusion amount W of the semiconductor layer 4a. Extremely favorable results are thus obtained.

Figure 16A:
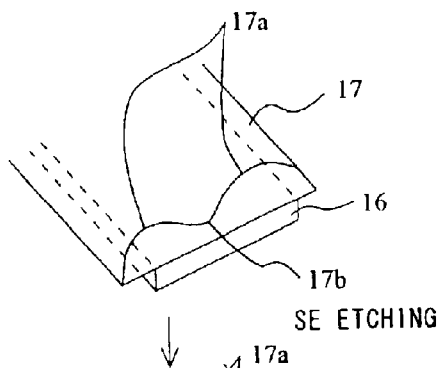
FIGS. 16A to 16E are step diagrams to illustrate fabrication processes of the thin film transistor array substrate according to a prior art.
Figure 16B:
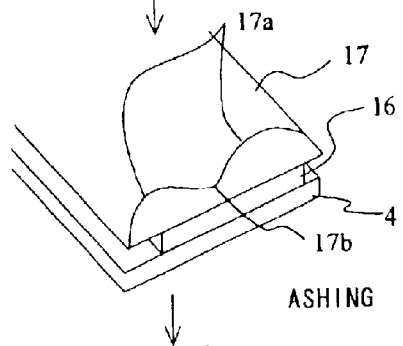
Figure 16C:
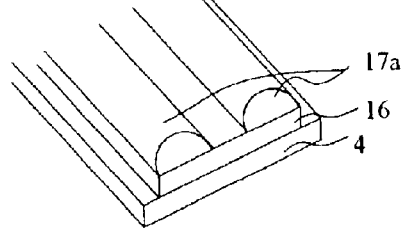
Figure 16D:
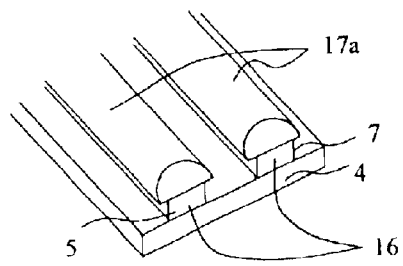
Figure 16E:
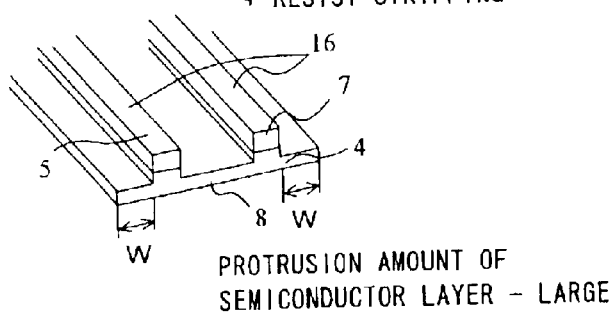
Figure 18:
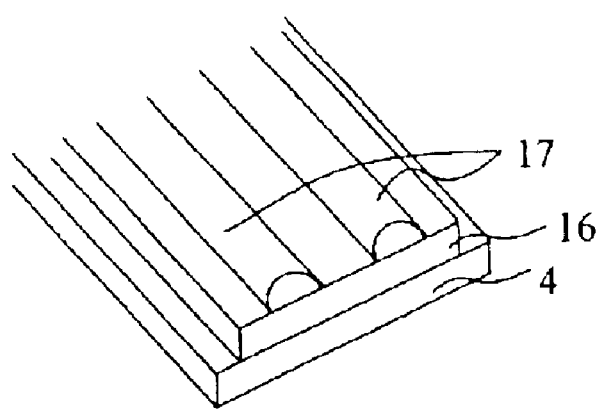
FIG. 18 is an enlarged view of a TFT section of the thin film transistor array substrate according to a prior art in course of fabrication.

In Case 3, the amount of Cr etching of the stage in FIG. 16A is 200 nm. In the SE etching of FIG. 16B that follows, the semiconductor pattern 4 is equalized with the ends of the resist pattern 17. Because ashing is then performed, the ends of the resist pattern 17 are cut away by 1000 nm in the transverse direction so as to lie 800 nm inwards from the Cr ends and 1000 nm inwards from the semiconductor pattern 4a, as shown in FIG. 18. Thereafter, etching of the Cr of the corresponding section to the semiconductor active layer 8 takes place and the Cr undergoes 200 nm side etching, meaning that the total of the protrusion amount W is then 1000+200=1200 nm.

The conditions indicated by Table 1 of this embodiment are representative conditions, and hence even if the conditions are changed, i.e. the Cr film thickness, the side etching amount, the etching conditions, the resist film thickness, the taper angle of the resist, and the ashing conditions, the effects of the present invention can be obtained. Moreover, because the cutaway amount of the resist pattern 17 in the transverse direction thereof and the amount of side etching of the metal film 16 when the semiconductor active layer 8 is etched are regulated such that the ends of the metal film 16 and the ends of the resist pattern 17 are made substantially equal, the protrusion amount W of the semiconductor layer 4a can be reduced and it is therefore possible to fabricate a TFT array substrate whereby degradation of the TFT characteristics are suppressed.

As explained in the foregoing, the present invention provides a TFT array substrate whereby degradation of the TFT characteristics caused by optical radiation is suppressed, a method of fabricating the same, and a liquid crystal display device employing the same.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A fabrication method of a thin film transistor array substrate, comprising:

a step of forming a gate line on an insulating substrate;

a step of forming a gate insulation film, a semiconductor layer, an ohmic layer, and a metal film on the insulating substrate on which the gate line is formed;

a step of forming a pattern of a resist on the metal film by a photolithography process to cover at least a source line, a source electrode, a drain electrode, and a corresponding section to a semiconductor active layer of a thin film transistor which are to be formed on the ohmic layer in following steps, the resist being thinner on the corresponding section to the semiconductor active layer than on other sections;

a step of etching the metal film to form the source line, the source electrode and the drain electrode;

a step of making the resist thinner to remove the resist on the corresponding section to the semiconductor active layer;

a step of removing the ohmic layer and the semiconductor layer of a section excluding the source line, the source electrode, the drain electrode, and the corresponding section to the semiconductor active layer by etching, after removing the resist on the corresponding section to the semiconductor active layer;

a step of removing the metal film on the corresponding section to the semiconductor active layer by etching; and a step of removing the ohmic layer on the corresponding section to the semiconductor active layer by etching.

2. A fabrication method of a thin film transistor array substrate, comprising:

a step of forming a gate line on an insulating substrate;

a step of forming a gate insulation film, a semiconductor layer, an ohmic layer, and a metal film on the insulating substrate on which the gate line is formed;

a step of forming a pattern of a resist on the metal film by a photolithography process to cover at least a source line, a source electrode, a drain electrode, and a corresponding section to a semiconductor active layer of a thin film transistor which are to be formed on the ohmic layer in following steps, the resist being thinner on the corresponding section to the semiconductor active layer than on the other sections;

a step of etching the metal film to form the source line, the source electrode and the drain electrode;

a step of making the resist thinner to remove the resist on the corresponding section to the semiconductor active layer;

a step of removing the ohmic layer and the semiconductor layer of a section excluding the source line, the source electrode, the drain electrode, and the corresponding section to the semiconductor active layer by etching, after removing the resist on the corresponding section to the semiconductor active layer;

a step of removing the metal film on the corresponding section to the semiconductor active layer by etching;

a step of removing the ohmic layer on the corresponding section to the semiconductor active layer by etching;

a step of forming an intermediate insulation film;

a step of forming a drain electrode contact hole leading to the drain electrode, a source terminal contact hole leading to the source electrode, and a gate terminal contact hole leading to the gate line, in the gate insulation film and the intermediate insulation film by a third photolithography process and etching;

a step of forming a conductive film; and a step of forming a pixel electrode covering the drain electrode contact hole, the source terminal contact hole, and the gate terminal contact hole, by a fourth photolithography process and etching.

3. A fabrication method of a thin film transistor array substrate according to claim 1 or 2, wherein side etching is performed in the step of etching the metal film to form the source line, the source electrode, and the drain electrode.

4. A fabrication method of a thin film transistor array substrate according to claim 3, wherein the metal film is removed by 0.5 µm to 1.3 µm by the side etching.

5. A fabrication method of a thin film transistor array substrate according to claim 1 or 2, wherein photolithography is performed using a half-tone mask in the step of forming the pattern of the resist being thinner on the corresponding section to the semiconductor active layer than on the other sections.

6. A fabrication method of a thin film transistor array substrate according to claim 1 or 2, wherein photolithography is performed using a plurality of masks in the step of forming the pattern of the resist being thinner on the corresponding section to the semiconductor active layer than on the other sections.

7. A fabrication method of a thin film transistor array substrate according to claim 1 or 2, wherein ends of the pattern of the resist are substantially aligned with ends of the metal film in the step of forming the pattern of the resist being thinner on the corresponding section to the semiconductor active layer than on the other sections.

8. A fabrication method of a thin film transistor array substrate according to claim 1 or 2, wherein the source line, the source electrode, and the drain electrode are made of a metal selected from the group consisting of Cr, Mo, Ti, W, Al and an alloy mainly comprising at least one of the metals.

9. A fabrication method of a thin film transistor array substrate according to claim 1 or 2, wherein ashing of RIE mode is performed to remove the resist on the corresponding section to the semiconductor active layer.

10. A thin film transistor array substrate fabricated by a fabrication method according to claim 1 or 2.

11. A liquid crystal display device comprising a thin film transistor array substrate according to claim 10.

* * * * *